United States Patent [19]

Chiu et al.

[11] Patent Number: 5,013,685

[45] Date of Patent: May 7, 1991

[54] METHOD OF MAKING A NON-ALLOYED OHMIC CONTACT TO III-V SEMICONDUCTORS-ON-SILICON

[75] Inventors: Tien-Heng Chiu, Spotswood; John E. Cunningham, Lincroft; Keith W. Goossen, Matawan, all of N.J.

[73] Assignee: AT&T Bell Laboratories, Murray Hill, N.J.

[21] Appl. No.: 430,558

[22] Filed: Nov. 2, 1989

[51] Int. Cl.$^5$ .......................................... H01L 21/44
[52] U.S. Cl. ................... 437/184; 437/185; 437/126; 437/132; 437/936; 437/966; 437/187; 437/189; 437/194; 437/105; 357/4; 357/16; 357/71
[58] Field of Search ............... 437/184, 185, 126, 936, 437/966, 187, 132, 105; 357/4, 16, 71

[56] References Cited

U.S. PATENT DOCUMENTS

| | | | |
|---|---|---|---|
| 4,662,060 | 5/1987 | Aina et al. | 437/185 |
| 4,772,934 | 9/1988 | Cunningham . | |
| 4,780,748 | 10/1988 | Cunningham . | |
| 4,784,967 | 11/1988 | Cunningham . | |
| 4,845,049 | 7/1989 | Sunakawa | 437/81 |
| 4,882,609 | 11/1989 | Schubert et al. | 357/16 |
| 4,942,438 | 7/1990 | Miyamoto | 357/4 |
| 4,961,194 | 10/1990 | Kuroda et al. | 357/16 |

OTHER PUBLICATIONS

K. W. Goossen et al., "GaAs-AlGaAs Multiquantum Well Reflection Modulators Grown on GaAs and Silicon Substrates", IEEE Photonic Technical Letters, Oct., 1989 (to be published).
Sorab K. Ghandi, "The Theory and Practice of Microelectronics", Wiley and Sons, New York, pp. 52-54 (1968).
E. F. Schubert et al., "Electron Mobility Enhancement and Electron-Concentration Enhancement in Delta-Doped n-GaAs at T=300K", Solid State Communication, vol. 63, No. 7, 1987, pp. 591-594, especially FIG. 4.

(List continued on next page.)

Primary Examiner—Brian E. Hearn
Assistant Examiner—Trung Dang
Attorney, Agent, or Firm—O. E. Alber

[57] ABSTRACT

This invention concerns with a non-alloyed ohmic contact to III-V semiconductor material in a III-V semiconductor device on a Si base. The ohmic contact includes at least one set of layers comprising a delta-doped monolayer and a thin layer of undoped III-V semiconductor material which is 2.5 nm or less in thickness, said at least one set of layers being upon a doped III-V semiconductor layer. An epitaxial layer of metal upon an uppermost of the layers of the said set of layers completes the ohmic contact, said metal being capable of wetting the surface of the III-V semiconductor material and of being epitaxially grown on the said III-V semiconductor material. At least the said at least one set of layers and the metal layer are deposited by Molecular Beam Epitaxy, thus avoiding formation of oxides and growing the metal epitaxially so that the metal layer is crystalline at least near the interface between the metal and the semiconductor material. The epitaxial deposition of the metal is conducted at a relatively low temperature of the semiconductor material. In an illustrative embodiment the metal is Al capable of being epitaxially deposited at a temperature within a range of from 10° C. to 100° C., preferably to a temperature ranging from 20° C. to 50° C., with 25° C. being most preferable. The resultant contacts exhibit specific resistance which is lower and higher current passing capabilities which are higher than those of prior art non-alloyed ohmic contacts. However, the most noteworthy advantage of using Al in an integrated opto-electronic circuit comprising a III-V semiconductor device on a Si base, is the avoidance of "purple plague". The "purple plague" may arise when gold-based contacts in III-V semiconductor devices and Al-based contacts in Si-devices being used in an integrated circuit come in contact, especially at higher, e.g. 300° C., temperatures.

16 Claims, 3 Drawing Sheets

OTHER PUBLICATIONS

C. E. C. Wood et al., "Complex Free-Carrier Profile Synthesis by Atomic-Plane Doping of MBE GaAs", Journal of Applied Physics, vol. 51, Jan. 1980, pp. 383-387.

E. F. Schubert et al., "Radiative Electron-Hole Recombination in a Sawtooth Semiconductor Super Lattice Growth by Molecular-Beam Epitaxy", Physical Review B, vol. 32, No. 2, Jul. 15, 1985, pp. 1085-1089.

E. F. Schubert et al., "The Delta-Doped Field Effect Transistor" Japanese Journal of Applied Physics, vol. 24, No. 8, Aug. 1985, pp. L608-L610.

R. H. Cox and H. Strack, "Ohmic Contacts for GaAs Devices", Solid State Electronics, vol. 10, pp. 1213-1218, 1967.

E. F. Schubert et al., "Delta-Doped Contacts to n-GaAs" Applied Physics Letters, vol. 49, Aug. 4, 1986, pp. 292-294.

W. T. Tsang, "In situ Ohmic-Contact Formation to n- and p-GaAs by Molecular Beam Epitaxy", Applied Physics Letters, vol. 33, Dec. 15, 1978, pp. 1022-1025.

(100 μm RADIUS DOT)

(50 μm RADIUS DOT)

METHOD OF MAKING A NON-ALLOYED OHMIC CONTACT TO III-V SEMICONDUCTORS-ON-SILICON

This invention relates to non-alloyed ohmic metal-to-III-V semiconductor contacts.

BACKGROUND OF THE INVENTION

A large effort is underway throughout the research community to combine integration of optical and electronic devices into monolitically integrated opto-electronic semiconductor systems. The effort includes the integration of III-V semiconductor devices with silicon. Such integration would permit fabrication of both III-V semiconductor and silicon circuits on a single chip. The recent demonstration of GaAs reflection multiple-quantum well modulators grown on silicon, has made the integration of optical and electronic devices even more attractive. See the article by K. W. Goossen et al. entitled "GaAs-AlGaAs Multiquantum Well Reflection Modulators Grown on GaAs and Silicon Substrates", IEEE Photonic Technology Letters, Vol. 1, October, 1989, pp. 304-306, which is incorporated herein by reference. Briefly, the article discloses a GaAs-AlGaAs Multiquantum Well Reflection Modulator on a Si Substrate. The device comprises an n-type layer of GaAs grown on an n-type Si substrate followed by, in succession from the substrate, an n-type GaAs buffer layer, a dielectric mirror consisting of 16 periods of n-type AlGaAs and n-type AlAs, 50 undoped multiple quantum wells consisting of GaAs and AlGaAs layers, followed by a p-type AlGaAs layer which is capped by a p-type GaAs.

The realization of practical integrated opto-electronic devices, however, necessarily involves metal interconnections and this introduces new issues such as those related to ohmic contact formation and metallurgy. Ohmic contacts are contacts which exhibit a linear current-versus-voltage characteristics and eliminate the inherently strong influence of the highly resistive surface depletion region present in the current-voltage characteristic of a metal-semiconductor junction. These type of contacts are an important element of all semiconductor devices, such as field-effect transistors, light-emitting diodes, lasers, photodetectors, modulators, etc.

An example of a non-alloyed ohmic contact on a III-V semiconductor material is disclosed in U.S. Pat. No. 4,772,934, issued on Sept. 20, 1988 to J. E. Cunningham et al., which is incorporated herein by reference. In this patent a non-alloyed ohmic contact is produced by depositing a gold layer on top of an uppermost thin (2.5 nm) layer of GaAs of a sequence composed of a plurality of sets of delta-doped monolyers and thin GaAs layers. The sequence begins with a delta-doped monolayer upon a buffer GaAs layer and ends with the thin GaAs layer, so that the gold layer is upon the buffer layer and is separated from a delta-doped layer by the said uppermost GaAs layer. Gold does not adhere well to GaAs, therefore, a layer of another metal such as Cr, Sn, etc, which adheres well to the GaAs surface, is deposited on the semiconductor surface prior to the deposition of the gold layer. U.S. Pat. No. 4,780,748 issued on Oct. 25, 1988 and U.S. Pat. No. 4,784,967 issued on Nov. 15, 1988 to J. E. Cunningham et al. each discloses an example of a semi-conductor device with a non-alloyed ohmic contact disclosed in U.S. Pat. No. 4,722,934, supra.

Established metallization technology for Si ICs, which is based on aluminum, is, however, incompatible with standard gold-based ohmic contacts used for III-V semiconductors such as GaAs, thus precluding the integration of GaAs and Si devices. Such incompatibility arises when Au-based ohmic contact to GaAs comes in contact with Al in the process of producing various interconnections of the Si IC. This leads to the formation of deleterious Au-Al compounds, a so called "purple plague", especially if the IC is subjected to heat. Specifically, $Au_2Al$, a tan-colored, brittle, poorly conducting compound forms in Si ICs at temperatures higher than 300° C., with simultaneous formation of $AuAl_2$, which is purple. For example, see Sorab K. Ghandi, "The Theory and Practice of Microelectronics", Wiley and Sons, New York, pp. 52-54 (1968). Thus, it is desirable to produce an ohmic contact to III-V semiconductor material, such as GaAs, which would be compatible with both the Si IC and the III-V semiconductor devices.

SUMMARY OF THE INVENTION

This invention involves a non-alloyed ohmic contact to III-V semiconductor material in a semiconductor device. The invention is useful in the area of opto-electronic integration, permitting monolitic integration of Si-based and III-V semiconductor-based devices on a single base, e.g. Si base. The non-alloyed contact is ohmic because of the presence of δ-doping at the surface of the semiconductor material. The contact is grown entirely by Molecular Beam Epitaxy (MBE), with the metal layer being deposited in the MBE chamber following the deposition of semiconductor layers. A suitable contact metal may be one compatible with aluminum-based silicon IC interconnection technology. Use of Aluminum allows GaAs/Si integration without the danger of the presence of the "purple plague" associated with Au and Al being in contact each with another. Also, use of aluminum as the metal of the contact results in contact resistance which is several times better (smaller) than the contact resistance of previous non-alloyed metal contacts to III-V semiconductors, such as Au contacts to GaAs. This may be partially attributed to the deposition of the metal (Al) before it is exposed to air so that no oxide forms at the GaAs surface. Furthermore, Al wets the GaAs surface forming an epitaxial relationship with GaAs so that the Al layer, at least at an interface between the GaAs crystal and the metal, is crystalline. An aluminum non-alloyed ohmic contact to GaAs, produced in accordance with this invention, has a contact resistance of about $2.5 \times 10^{-6}$ $\Omega cm^2$ permitting interconnection of GaAs devices to silicon circuits, and thus integration of GaAs devices into the Si ICs. Furthermore, contacts may be subjected to higher currents, thus enabling use of smaller contacts for closely spaced devices.

BRIEF DESCRIPTION OF THE DRAWING

The invention will be better understood after reading the following detailed description in conjunction with the drawings, wherein.

DETAILED DESCRIPTION

Figure 1:
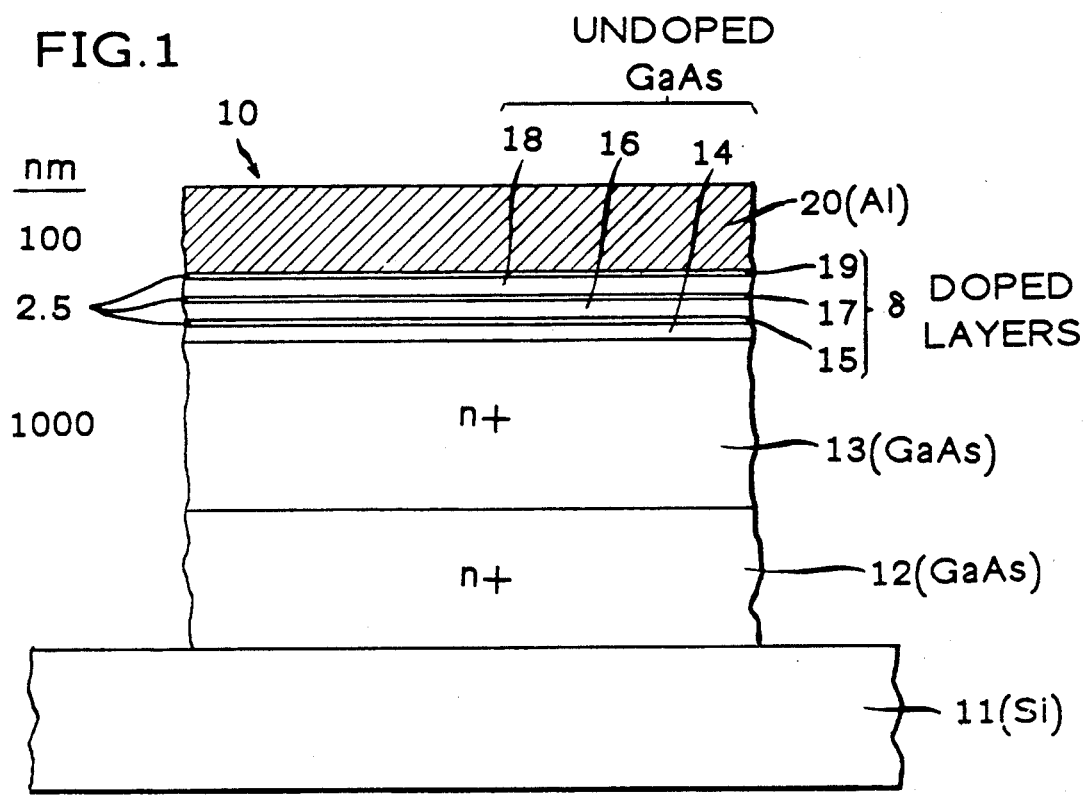
FIG. 1 is a cross-section of a III-V semiconductor material device on silicon, in which an ohmic Al contact has been created in accordance with the present invention.

An embodiment of the present invention, in which an ohmic contact was formed on a III-V semiconductor substrate on silicon, is illustrated in cross-sectional form in FIG. 1. In this Figure, numeral 11 denotes a silicon base, e.g. an n-type Si chip or wafer base, which may form a part of a silicon-based integrated circuit (Si IC). Upon the Si base is shown exemplary III-V semiconductor layered structure 10 including a non-alloyed ohmic contact. The III-V semiconductor material may be chosen from such III-V semiconductor materials as GaAs, AlGaAs, InAsInP, InGaAs, InGaAsP, InAlGaAs, GaSb, InSb. For illustration purposes, the III-V semiconductor is GaAs, the dopant is Si, and the metal of the contact is Al. The layers of layered structure 10 are grown by the MBE technique. In the exemplary embodiment, the layered structure consists of an n+ GaAs substrate, 12, 1 μm thick n+ homogeneously Si-doped ($10^{18}\ cm^{-3}$) GaAs (buffer) layer, 13, followed by a δ-doped sequence grown upon the buffer layer. This sequence includes one or more sets of layers, each set including a 2.5 nm layer of undoped GaAs (e.g. 14, 16, 18) followed by a delta-doped monolayer sheet (e.g. 15, 17, 19) of Si ($10^{13}/cm^2$). More than one set of layers may be used to insure the non-alloyed contact. A delta-doped monolayer may also precede the deposition of an undoped GaAs layer on the buffer layer. In those instances where more than one of said sets of layers is deposited on the GaAs buffer layer or where the said delta-doped monolayer is deposited on the GaAs buffer layer, the density of the doping concentration of the uppermost delta-doped layer (e.g. 19) may be varied between zero and $5 \times 10^{13}/cm^2$. A smooth metallic contact, a 100 nm thick Al layer, 20, is epitaxially deposited in the MBE chamber, directly on the final layer in the sequence without exposing previously grown surface to atmosphere, thus avoiding presence of an oxide at the semiconductor-metal interface.

To produce the layered structure 10, Si base 11 is placed in a Vacuum Generator MBE system, e.g. model V80, equipped with two growth chambers interconnected by a trolly interlock stage. In this system, conventional effusion cells in one chamber of the MBE system are used for evaporation of group III elements and of the dopant material, in this instance of gallium and silicon, respectively. The group V element, arsenic, is obtained from arsene $AsH_3$ which was cracked by heating in the MBE chamber. The metal layer, Al, is epitaxially deposited either in the same or in the other chamber of the MBE system without breaking the vacuum. Prior to the deposition of the metal layer, the temperature of the surface upon which the metal is deposited is lowered to a temperature within a range of from 10° C. to 100° C., preferably to a temperature ranging from 20° C. to 50° C., with 25° C. being most preferable.

Heavily doped n+ type GaAs layer 12 was permitted to grow on an n-type Si base 11, followed by the growth of doped buffer layer 13 which was grown on layer 12 to a thickness of one micrometer with a three-dimensional dopant (Si) density $N_d$ equal to about $10^{18}\ cm^{-3}$. Thereafter, the supply of Si was interrupted by closing the silicon-effusion cell, permitting the growth of normal, undoped gallium arsenide for a period sufficient to grow a gallium arsenide crystal for about 2.5 nm in thickness, thereby creating layer 14. At this point in time, the growth of the gallium arsenide crystal was interrupted by closing the gallium-effusion cell to permit the crystal to be exposed only to the arsenic and silicon, thereby permitting delta-doped layer 15 to be grown on layer 14. The number of minutes required for a predetermined density of silicon may be calculated by using the knowledge obtained from previous growths relating to the rate of silicon deposit. In the embodiment which was constructed, the crystal growth was interrupted for about 23 minutes, thereby achieving a silicon two-dimensional density of about $5 \times 10^{13}/cm^2$. Since the GaAs crystal normally has approximately $6 \times 10^{14}$ gallium atoms per square centimeter, this interruption of growth essentially places a silicon atom at about one out of ten gallium sites on the crystal. For example, see E. F. Schubert et al. "Electron Mobility Enhancement and Electron-Concentration Enhancement in delta-doped n-GaAs at T=300K", Solid State Communication, Vol. 63, No. 7, 1987, pp. 591-594, especially FIG. 4.

The process for regrowing the thickness of 2.5 nm of normal undoped GaAs crystal and for closing the gallium-effusion cell to grow the Si monolayer was repeated in the exemplary embodiment during two more intervals resulting in normal, undoped crystal layers 14, 16, and 18 and delta-doped layers 15, 17 and 19, all shown in FIG. 1. To complete the contact, the substrate and the deposited layers are cooled to a temperature low enough to enable epitaxial deposition of a metal. A suitable temperature for deposition of Al falls within a range of from 10° C. to 100° C., preferably from 20° C. to 50° C. Temperatures lower than 10° C. are possible but not economical. In the illustrative example, the temperature was lowered to a range of from 20° C. to 50° C. such as 25° C., and aluminum was deposited in the second one of the MBE chambers directly on the surface of delta-doped layer 19 in a thickness of about 100 nm to create layer 20.

As pointed out hereinabove, the silicon in the delta-doped layer achieved a two-dimensional doping concentration of $5 \times 10^{13}/cm^2$. In the crystal which was grown, with a lattice constant of 0.56 nm, this two-dimensional doping concentration has yielded a three-dimensional silicon concentration of about $10^{19}-10^{21}\ cm^{-3}$. This doping concentration is far in excess of what can be achieved through the normal crystal growth using silicon as a dopant. Accordingly, a lower resistance contact has been obtained as a result, thus permitting avoidance of an alloying step.

Layers 15, 17, and 19 in FIG. 1 are called delta-doped layers in the present specification, but other terms have been used in the prior art. This type of doping essentially provides an increased amount of dopant in a single atomic plane or monolayer of the crystal. Accordingly, some prior art have described this doping as atomic-plane doping. For example, see the article by C. E. C. Wood, et al., entitled "Complex free-carrier profile synthesis by "atomic-plane" doping of MBE GaAs" *Journal of Applied Physics*, Vol. 51, January 1980, pp. 383-387 or see the article by E. F. Schubert et al., entitled "Radiative electron-hole recombination in a sawtooth semiconductor super lattice growth by molecular-beam epitaxy," *Physical Review B*, Vol. 32, No. 2, Jul. 15, 1985, pp. 1085-1089, which article is incorporated herein by reference. The term delta-doped comes from the Dirac-delta function which is a useful way to describe the charge density in the delta-doped monolayers even though it is not, strictly speaking, accurate since the Dirac-delta function has problematic physical meaning at its center.

Figure 2:
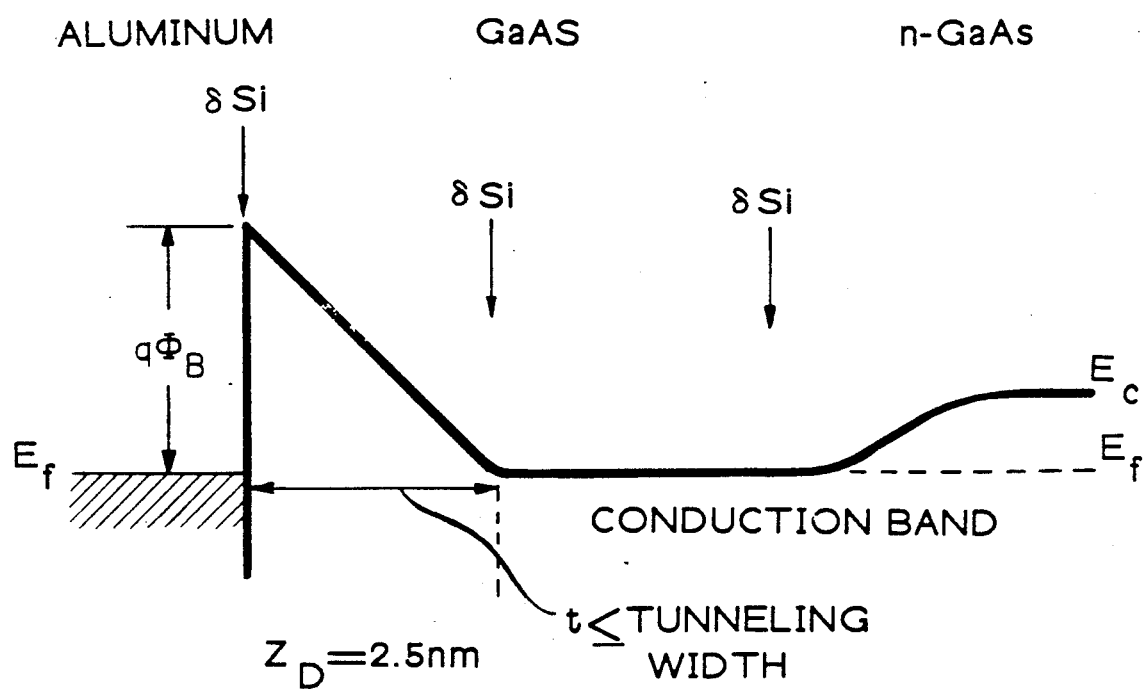
FIG. 2 is an energy band diagram of δ-doped n-type semiconductor-metal junction wherein a sheet of dopant lies a distance $z_D$ away from the surface creating a thin barrier through which carriers may tunnel.

A theoretical understanding of the present invention can be achieved by studying the band gap energy diagram shown in FIG. 2. The diagram shown in FIG. 2 is for a metal to semiconductor interface where a delta-doped monolayer, e.g. layer 17, has been fabricated at a distance of $z_D$ from the interface. In this diagram, $E_c$ is the edge of conduction energy, $E_F$ is the Fermi energy, q is the elementary charge, $\phi_B$ is the potential height of the Schottky barrier at the metal semiconductor interface, $q\phi_B$ is the energy height of the Schottky barrier at the metal semiconductor interface, and $z_D$ is the distance from the interface to the delta-doped atomic layer. Except for the absence of the valence band energy, with $E_v$ being the edge of the valence-band energy, and positioning of the uppermost of the δ-doped layers (e.g. 19), this diagram resembles the one shown in FIG. 1 of the article by E. F. Schubert et al., entitled "The Delta-Doped Field Effect Transistor", Japanese Journal of Applied Physics, Vol. 24, No. 8, August 1985, pp. L608-L610 or in U.S. Pat. No. 4,772,934 issued Sept. 20, 1988 to John E. Cunningham et al.

When the delta-doped monolayer (e.g. 17) is placed at a distance $z_D$ from the metal 20-to-semiconductor 18 interface, the tunneling barrier t is thin, ($t \leq z_D$) and consequently quantum-mechanical tunneling through the barrier provides the dominant transport mechanism. The delta-doped monolayer (e.g. 17) creates a reservoir of electrons at a distance t from the metal to semiconductor interface. A major fraction of these electrons which originate from donors of the delta-doped layer occupy surface states at the metal-semiconductor interface.

In addition to minimizing the tunneling distance and hence lowering contact resistance, the invention also encompasses the nature of the Fermi-level pinning process. Fermi-level pinning at the surface normally causes most non-alloyed metal contacts to GaAs to be rectifying due to the presence of a surface barrier. The δ-doping produces strong band bending near the surface, causing the surface barrier to be much thinner, i.e., its thickness is the separation between the surface and the dopant sheet. Thus, carriers can easily tunnel from the metal to the GaAs, hence the contact is ohmic. However, many metal-semiconductor choices for the ohmic contact junction necessarily produce higher electronic energy mismatch across the junction and must, therefore, be relieved by defect formation either in the GaAs or metal or both. Such defect formations in the GaAs near the surface region are believed to contribute to the formation of $\phi_B$ and resulting Fermi-level pinning. By addition of a delta-doped layer (e.g. 19) near the surface-metal junction, free carriers efficiently fill the deep levels at mid-gap and reduce the Fermi-level pinning process. By choice of Al as a metal capable of wetting GaAs and of being epitaxially grown on GaAs, the electronic energy mismatch comprising the metal-semiconductor junction can be minimized. The presence of Si at the interface between the metal surface and the surface of the undoped III-V layer further insures reduction of any possible electronic energy mismatch and thus, reduction of the Fermi-level pinning.

A theoretical analysis of a single delta-doped monolayer, such as monolayer 17, can be conducted to obtain an expression for the specific contact resistance versus distance from the interface $z_D$. To determine a specific contact resistance, the equations developed by R. H. Cox and H. Strack may be utilized. See the article by R. H. Cox and H. Strack entitled "Ohmic Contacts for GaAs Devices", *Solid State Electronics*, Vol. 10, pages 1218-1218, 1967, which is incorporated herein by reference. The theoretical specific contact resistance ($\rho_c (\Omega cm^2)$) has been calculated assuming only tunneling current:

$$\frac{1}{\rho_c} = \left(\frac{q}{2\pi \hbar z_D}\right)^2 (h - z_D) \sqrt{qm^*\phi_B} \, e^{z_D \sqrt{\dots \phi_B}}$$

Figure 3:
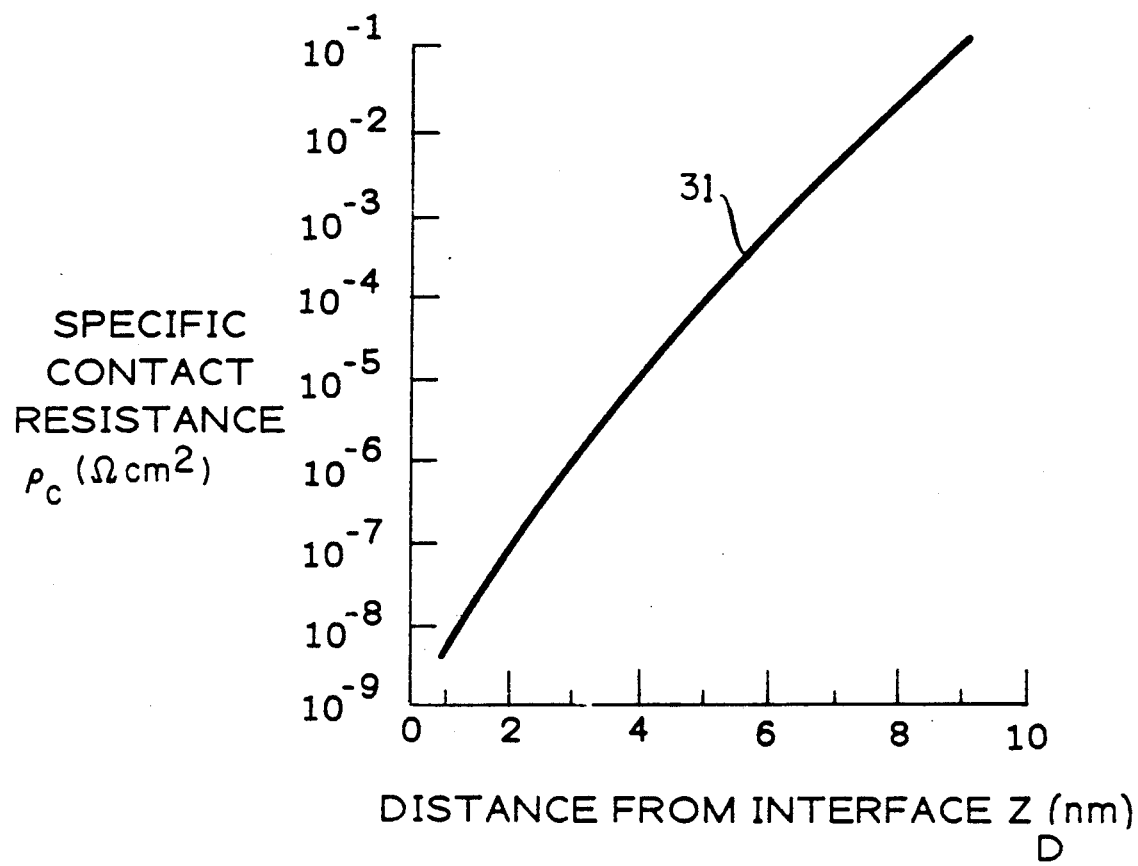
FIG. 3 is a diagram of theoretical contact resistance as a function of a dopant sheet distance from the interface between the metal and the semiconductor.

The variables are defined in FIG. 3, which shows the expected specific contact resistance as a function of $z_D$. This expression has been plotted in FIG. 3 and shown as curve 31. As indicated in FIG. 3, a distance $z_D$ of 2.5 nm from the interface theoretically yields a specific contact resistance falling between $10^{-6}$ and $10^{-7}$ ohm-cm$^2$. As shown in FIG. 3, the specific contact resistance is low as long as the distance from the interface for the delta-doped monolayer is on the order of the lattice constant. While a single δ-doped layer and a single thin (2.5 nm) GaAs layer are sufficient to establish a nonalloyed ohmic contact, a plurality of sets composed of the thin GaAs layers and delta-doped layers, may be utilized in order to insure low contact resistance.

Figure 4:
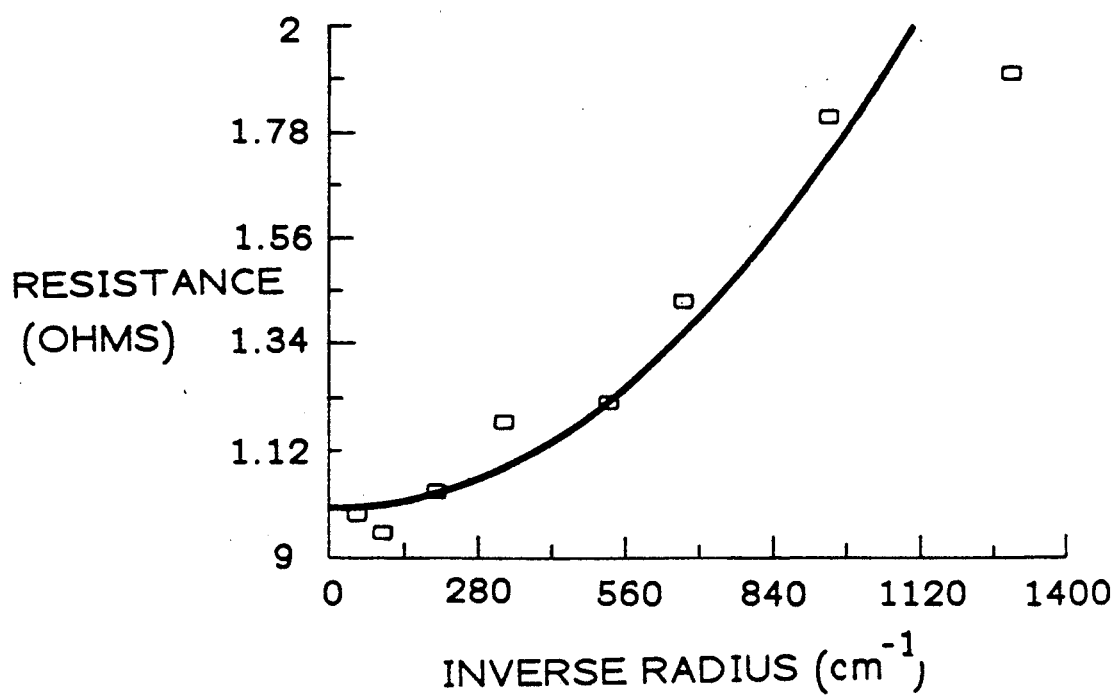
FIG. 4 is a diagram of a measured substrate-Al dot resistance vs. inverse radius of dots (represented as boxes) and corresponding fit assuming a dot-independent resistance of 1 ohm and a contact resistance of $2.5 \times 10^{-6}\ \Omega cm^2$.

A plot of the contact resistance ($R_i - R_o$) versus the inverse radius size of the contact is shown in FIG. 4. To obtain the experimental points, contacts with different size radii were established and measured and compared with the theoretical curve predicted by R. H. Cox and H. Strack, supra. In order to measure the contact resistance, dots of varying sizes were defined in the aluminum. This was performed by spinning on negative resist (HNR 120), which was lithographically exposed and developed to leave dots of resist which were then hard-baked at 120° C. Then the sample was placed in a 100:1 H$_2$O:HF solution which removed the Al not covered by resist. Since the sample has been indium mounted in the MBE chamber, an ohmic contact has already been formed to the backside of the substrate. To use this, indium was melted on a copper plate at 200° C., the sample placed on this and the plate was then quickly removed and cooled, so that the sample was welded to the plate.

Dots of radius 195, 100, 50, 30, 19, 15, 10.5 and 7.5 μm were used. In FIG. 4 are shown the resistances obtained as a function of inverse radius (1/r) (boxes). The resistances consist of that due to the measuring apparatus and back contact ($R_o$) which is independent of dot size, and the contact resistance ($\rho_c \times r^2$) and spreading resistance in the substrate. For small dots the spreading resistance equals $\rho sub./(8r)$, and assuming a substrate resistivity of 1000 $\mu\Omega$-cm, this is 0.17 ohms for the smallest dot. Therefore, the spreading resistance is being ignored (and thus the actual values of $\rho_c$ are lower than the estimates). The solid line in FIG. 4 is $R_o + \rho_c \times r^2$, where $R_o$ is 1.0 ohms and $\rho_c$ is $2.5 \times 10^{-6}$ $\Omega cm^2$. The calculated fit to the experimental data compares favorably with the measured specific contact resistance of $2.5 \times 10^{-6}$ ohm-$cm^2$ illustrated in FIG. 4.

Figure 5:
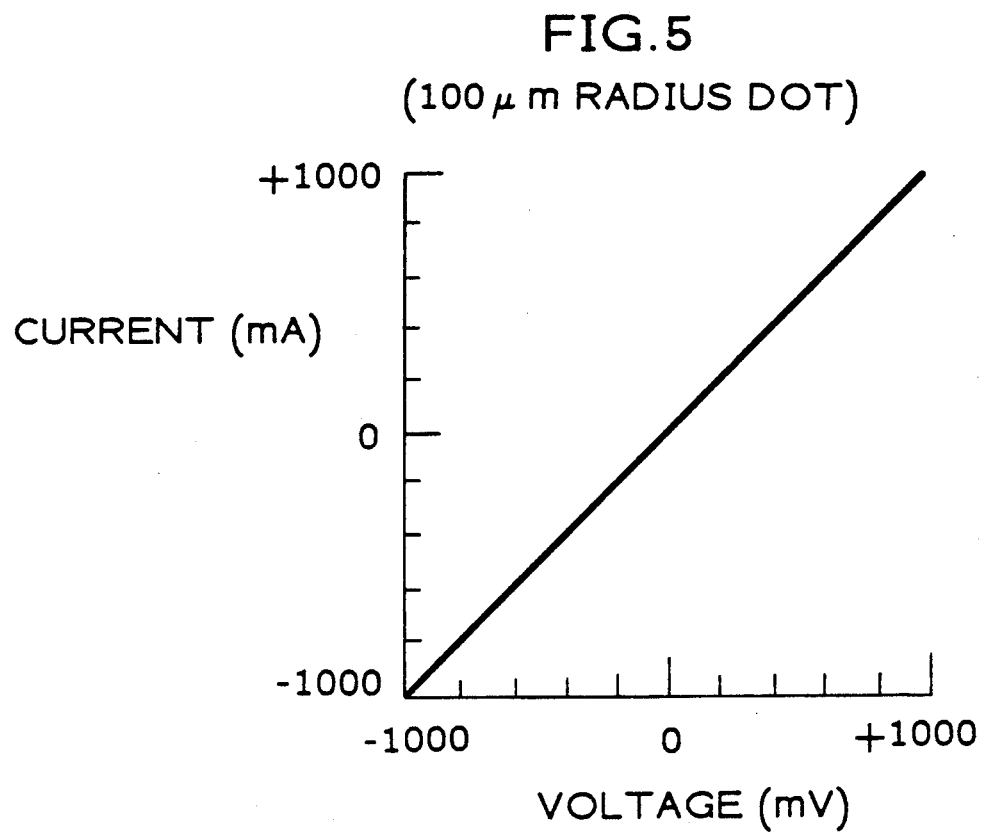
FIG. 5 is a diagram of a current-voltage curve for a 100 um radius dot showing linearity up to 600 mA and current-carrying capability up to 1 A.
Figure 6:
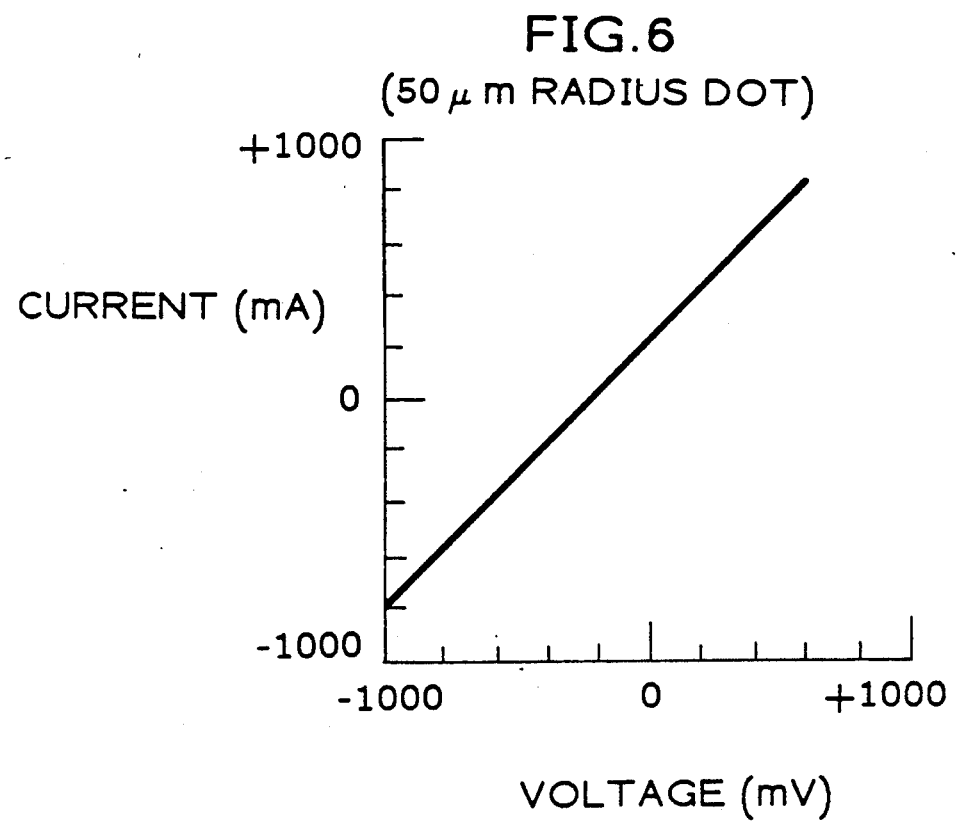
FIG. 6 is a diagram of a current-voltage curve for a 50 um radius dot showing linearity up to 400 mA and current-carrying capability up to 0.8 A.

The dot-substrate current-voltage (I-V) curves were strictly linear below 100 mA for all dot sizes. Excellent linear ohmic characteristics were achieved for a non-alloyed delta-doped contacts having a radius of 100 and 50 micrometers. The current versus voltage (I-V) characteristic of these contacts is shown in FIGS. 5 and 6, respectively. The total resistance of 1.0 ohms demonstrates the high potential of the present ohmic contact method. As indicated in FIGS. 5 and 6, the current-voltage characteristic exhibits strictly linear behavior with S- and N- shaped patterns absent on all scales. An onset of minor nonlinearity is at about 600 mA for the 100 $\mu$m radius dot and at about 400 mA for the 50 $\mu$m radius dot. The onset and the minor nonlinearity are not sufficiently pronounced to be shown in the drawings. The linearity exists for higher positive voltages on the substrate than for negative voltages, indicating the importance of tunneling to the contact. The 100 $\mu$m radius dot was capable of passing 1 A and the 50 $\mu$m radius dot was capable of passing 0.8 A of current before catastrophic failure.

In contrast, previous attempts at non-alloyed contacts to GaAs demonstrated contacts which were linear up to 250 mA for dot radii greater than 135 $\mu$m. For an example of non-alloyed contacts to GaAs using highly doped homogenous layers rather than delta-doped layers see an article by W. T. Tsang entitled "In Situ Ohmic-Contact Formation to n- and p-GaAs" by Molecular Beam Epitaxy, *Applied Physics Letters*, Vol. 33 (1979) p. 1022–1025). Also see previous work using delta-doping: (an article by E. F. Schubert et al. in *Applied Physics Letters*, Vol. 49 (5), August, 1986 p. 292–294, as well as U.S. Pat. No. 4,772,934 issued Sept. 20, 1988 to John E. Cunningham et al.

Another advantage of the use of metal such as aluminum is the ability to wet etch patterns on the surface of the metal deposited on the semiconductor substrate. In the MBE process, the metal is deposited as a layer on the semiconductor surface, without an intervening step of resist pattern deposition. The layer of metal (Al) may then be either wet etched or dry etched. In contrast, gold layer in the III-V semiconductor contact formation is typically deposited on the semiconductor surface through a previously formed resist mask and, then, gold overlying the resist is removed by lift-off technique. Removal of an excess portions of a layer of gold deposited directly on the semiconductor or substrate (not through a resist mask) typically results in the damage to the semiconductor surface.

Numerous departures from the present embodiment may be made without departing from the spirit and scope of the present invention. For example, other metals than aluminum may be used for the contact. These metals could be elements, alloys or intermetallic compounds, such as NiAl, CoAl. They should satisfy at least the following requirements: posses high conductivity characteristics, wet the surface of the semiconductor material upon which it is deposited, be capable of being epitaxially grown on the semiconductor material, be compatible with the III-V semiconductor as well as with the Si technology so as to avoid affecting adversely either one or both. Other dopants may be utilized in order to produce n-type gallium arsenide. For example, elements from group IV in the Periodic Table of elements, such as, germanium and tin, and elements from group VI, such as, sulfur, selenium, and tellurium, may be so utilized. To produce P-type delta-doped monolayers, elements from group II, for example, beryllium and magnesium. In addition, manganese, zinc and carbon may be used. For example, to produce a non-ohmic contact to the p-type GaAs structure on Si disclosed in FIG. 1 of the K. W. Goossen et al. article, supra, a sequence of GaAs and $\delta$-doped monolayer followed by an Al layer to the sequence, may be deposited in place of the p-type GaAs cap layer. In this instance, the p-dopant may be selected from Be, Zn, Mg and C.

We claim:

1. A method of fabricating a semiconductor device which comprises a doped layer of III-V semiconductor material and an ohmic contact to the doped layer, which comprises
   (a) depositing upon a doped layer of III-V semiconductor material at least one set of layers comprising a delta-doped monolayer and a thin layer of undoped III-V semiconductor material, said thin layer being 2.5 nanometer or less in thickness, and
   (b) epitaxially depositing an aluminum layer upon an uppermost of the layers of said at least one set of layers to complete the ohmic contact, said uppermost of the layers being a delta-doped monolayer.

2. The method as defined in claim 1, in which said metal is capable of wetting the surface of the III-V semiconductor material and of being epitaxially grown in a crystalline state on the said III-V semiconductor material.

3. The method as defined in claim 1, in which at least said at least one set of layers and the metal layer are deposited by Molecular Beam Epitaxy technique.

4. A method as defined in claim 1, in which, prior to depositing the metal layer, the temperature of the device being fabricated is lowered to a temperature sufficient to enable epitaxial deposition of the metal.

5. The method as defined in claim 1, in which at least said at least one set of layers and the Al layer are deposited by Molecular Beam Epitaxy, and in which prior to depositing the Al layer the device being fabricated is cooled to a temperature ranging from 10° C. to 100° C.

6. The method as defined in claim 5, in which said temperature ranges from 20° C. to 50° C.

7. The method as defined in claim 5, in which said temperature is 25° C.

8. The method as defined in claim 1, wherein a plurality of said at least one set of layers are arranged between said doped layer and the metal layer.

9. The method as defined in claim 8, wherein said plurality includes three of said at least one set of layers.

10. The method as defined in claim 1, further comprising an additional delta-doped layer being deposited intermediate the doped-layer and said at least one set of layers.

11. The method as defined in claim 1 of said III-V semiconductor material comprises a material selected from the group consisting of GaAs, AlGaAs, InP, InGaAs, InGaAsP, InAs, InAlGaAs, GaSb, InSb.

12. The method as defined in claim 1, wherein said delta-doped monolayer comprises a dopant selected from the group consisting of Group II, Group IV elements and group VI elements of the Periodic Table of elements, said Group II elements including beryllium and magnesium, said Group IV elements including germanium, silicon and tin and said Group VI elements including selenium, sulfur and tellurium, said dopant further including carbon, manganese or zinc.

13. The method as defined in claim 1, in which the III-V semiconductor material comprises GaAs, the dopant comprises Si, and the metal comprises Al.

14. The method as defined in claim 1, wherein said semiconductor device comprises a Si-base.

15. The method as defined in claim 1, wherein said semiconductor device comprises a III-V semiconductor substrate grown upon a Si-base.

16. The method as defined in claim 15, in which said III-V semiconductor substrate comprises n-type GaAs and said Si-base comprises n-type Si.

* * * * *